(12) United States Patent
Hsu

(10) Patent No.: US 7,332,925 B2
(45) Date of Patent: Feb. 19, 2008

(54) ENGAGING DEVICE OF CIRCUIT BOARD

(75) Inventor: Cheng-Chung Hsu, Taipei (TW)

(73) Assignee: Inventec Corporation (TW)

( * ) Notice: Subject to any disclaimer, the term of this patent is extended or adjusted under 35 U.S.C. 154(b) by 114 days.

(21) Appl. No.: 11/395,930

(22) Filed: Mar. 30, 2006

(65) Prior Publication Data

US 2007/0152697 A1 Jul. 5, 2007

(51) Int. Cl.
*G01R 31/02* (2006.01)

(52) U.S. Cl. .................... 324/765; 324/158.1; 439/296

(58) Field of Classification Search ..................... None

See application file for complete search history.

(56) References Cited

U.S. PATENT DOCUMENTS 5,256,078 A * 10/1993 Lwee et al. ................. 439/326

\* cited by examiner

*Primary Examiner*—Minh N. Tang
(74) *Attorney, Agent, or Firm*—Peter F. Corless; Steven M. Jensen; Edwards angell Palmer & Dodge LLP

(57) ABSTRACT

An engaging device of a circuit board is disclosed. The engaging device is for engaging a circuit board having a positioning hole to a housing of an electronic device. The engaging device includes a conductive hook fixed to the housing, the conductive hook including a hook portion for being hooked to the positioning hole, and a contacting end formed on an end of the hook portion; and a conductive slice fixed to a side of the circuit board, corresponding to the positioning hole for contacting with the contacting end when the hook portion is hooked to the positioning hole, so as to allow static electricity generated by the circuit board to be conducted to the housing, and improve engaging strength of the conductive hook and the housing.

9 Claims, 4 Drawing Sheets

ENGAGING DEVICE OF CIRCUIT BOARD

BACKGROUND OF THE INVENTION

1. Field of the Invention

This invention relates to engaging devices of circuit boards, and more particularly, to an engaging device of a circuit board for a server.

2. Description of Related Art

With the development of information technologies, electronic devices are becoming one of the most popular information apparatus in daily life. An electronic device comprises a variety of components, such as a hard disk drive, a power supply and a circuit board, all of which are installed in a housing of the electronic device. The electronic device further comprises a memory, a central processing unit (CPU) and a fan, all of which are installed on the circuit board. As users demand an electronic device to have more functionalities, the electronic device has to comprise more components. However, when the electronic device is operating, static electricity is gathering more and more on the circuit board. Such the static electricity, if gathering on the circuit board continuously, likely causes damages. According to the prior art, the circuit board adopts a standoff to stand itself up and fix itself to the housing of the electronic device. However, the standoff is used to fix the circuit board only, without performing any ground effect. Therefore, a ground structure of the prior art is disclosed for conducting the static electricity gathered on the circuit board to ground, so as to protect the circuit board from the damage of the static electricity.

FIG. 1 is a cross sectional view of a ground structure of a circuit board 5 according to the prior art. As shown in FIG. 1, the ground structure of the circuit board 5 comprises a conductive pole 11 engaged with a housing of an electronic device, and an elastic clamp 12 installed on the circuit board 5. The conductive pole 11 comprises a head portion 112 and a circular concave 111 connected to the head portion 112. The elastic clamp 12 comprises a clamping buckle 122 engaged with a side of a lock hole 53 of the circuit board 5 and contacting with two conductive films 51 installed on the circuit board 5. A convex slice 1211 of the elastic clamp 12 engages itself automatically with a positioning hole 54 of the circuit board 5 to fix the elastic clamp 12. A screw hole 52 of the circuit board 5 passes through the head portion 112 of the conductive pole 11 and disposes itself on the circular concave 111. The circuit board 5 moves toward a direction indicated by arrow A, to enable the head portion 112 of the conductive pole 11 to contact with a top board 123 of the elastic clamp 12 and prop against the lock hole 53 of the circuit board 5, so as to complete positioning and ground processes.

However, in the positioning process, because the top board 123 of the elastic clamp 12 is pushed by the head portion 112 of the conductive pole 11, the elastic clamp 12 will be deformed, enabling a convex slice 1211 of a flat board 121 of the elastic clamp 12 to be departed from the positioning hole 54 of the circuit board 5. Therefore, the elastic clamp 12 does not contact with the conductive film 51 very well, and the conduction of the static electricity is affected.

In view of the above drawbacks, another ground structure of the circuit board 5 comes to the market. Please refer to FIG. 2, which is an explosive view of the ground structure according to the prior art. Compared with the ground structure shown in FIG. 1, the ground structure shown in FIG. 2 further comprises an elastic washer 7 accommodated on the circular concave 211 of the conductive pole 21. The ground structure has a feature that by pushing the flat board 221 of the elastic clamp 22 with the elastic force of the elastic washer 7, the elastic clamp 22 can contact with the conductive film 51 completely, so as to overcome the drawbacks that the elastic clamp 12 does not contact with the conductive film 51 very well.

However, the above ground structure of the circuit board 5 adopts the elastic washer 7 to enable the elastic clamp 22 to contact with the conductive film 51 completely, but the installation of the elastic washer 7 increases the manufacturing cost. Moreover, the elastic washer 7 is easily eroded, so as to impact positioning and ground capabilities of the ground structure. The eroded elastic washer 7 will adhere to the elastic clamp 22, enabling the circuit board 5 hard to be took out. If the circuit board 5 is took out by force, the elastic washer 7 is easily broken. When the elastic clamp 22 is installed on the circuit board 5, the circuit board 5 has to comprise a plurality of positioning holes 54 to allow the elastic clamp 22 to be positioned on the circuit board 5 accurately, this also increasing the manufacturing cost.

Therefore, how to overcome the drawbacks of the prior art is becoming one of the most urgent errands in the art.

SUMMARY OF THE INVENTION

In views of the above-mentioned problems of the prior art, it is a primary objective of the present invention to provide an engaging device of a circuit board for reducing the manufacturing cost.

It is another objective of the present invention to provide an engaging device of a circuit board for fixing and grounding a circuit board and conducting the static electricity generated by the circuit board to ground.

It is a further objective of the present invention to provide an engaging device of a circuit board having a simple structure and easy to be manufactured.

To achieve the above-mentioned and other objectives, an engaging device of a circuit board is provided according to the present invention. The engaging device is for engaging a circuit board having a positioning hole with a housing of an electronic device. The engaging device includes a conductive hook fixed to the housing, the conductive hook comprising a hook portion for being hooked to the positioning hole, and a contacting end formed on an end of the hook portion; and a conductive slice fixed to a side of the circuit board corresponding to the positioning hole, for contacting with the contacting end when the hook portion is hooked to the positioning hole, so as to allow static electricity generated by the circuit board to be conducted to the housing, and improve the engaging strength of the conductive hook and the housing.

The conductive hook further includes a first engaging portion connected and installed perpendicularly to the hook portion for fixing to the circuit board. The first engaging portion includes a plurality of screw holes for fixing, along with screws, to the housing. The hook portion includes an opening larger than the circuit board in thickness, and the contacting end is located on an outer end the opening. The hook portion further includes a fixing end located in on an inner end of the opening.

The conductive slice includes a second engaging portion for fixing to a surface of the circuit board, and a top portion for contacting with the contacting end. According to the preferred embodiment, the second engaging portion is adhered to the surface of the circuit board by a soldering technique, a riveting technique or a surface mount technology (SMT) technique, the top portion is in the shape of an arc, the conductive slice is a metal leaf spring, a leaf steel, a spring slice, a spring or any other equivalent members capable of generating elastic forces.

In summary, the present invention has the advantages of low manufacturing cost, connecting the circuit board and conducting the static electricity thereon to ground, so as to overcome the drawbacks of the prior art, such as a defect of contact and high manufacturing cost.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention. Note that all of the following figures are schematic figures, which are used to illustrate schematically a basic structure of the present invention. Therefore, only those components related to the present invention are drawn in these figures, and these components are drawn not based on their actual sizes and shapes. In implementation, the present invention can have a variable and more complicated layout of components.

Figure 1:
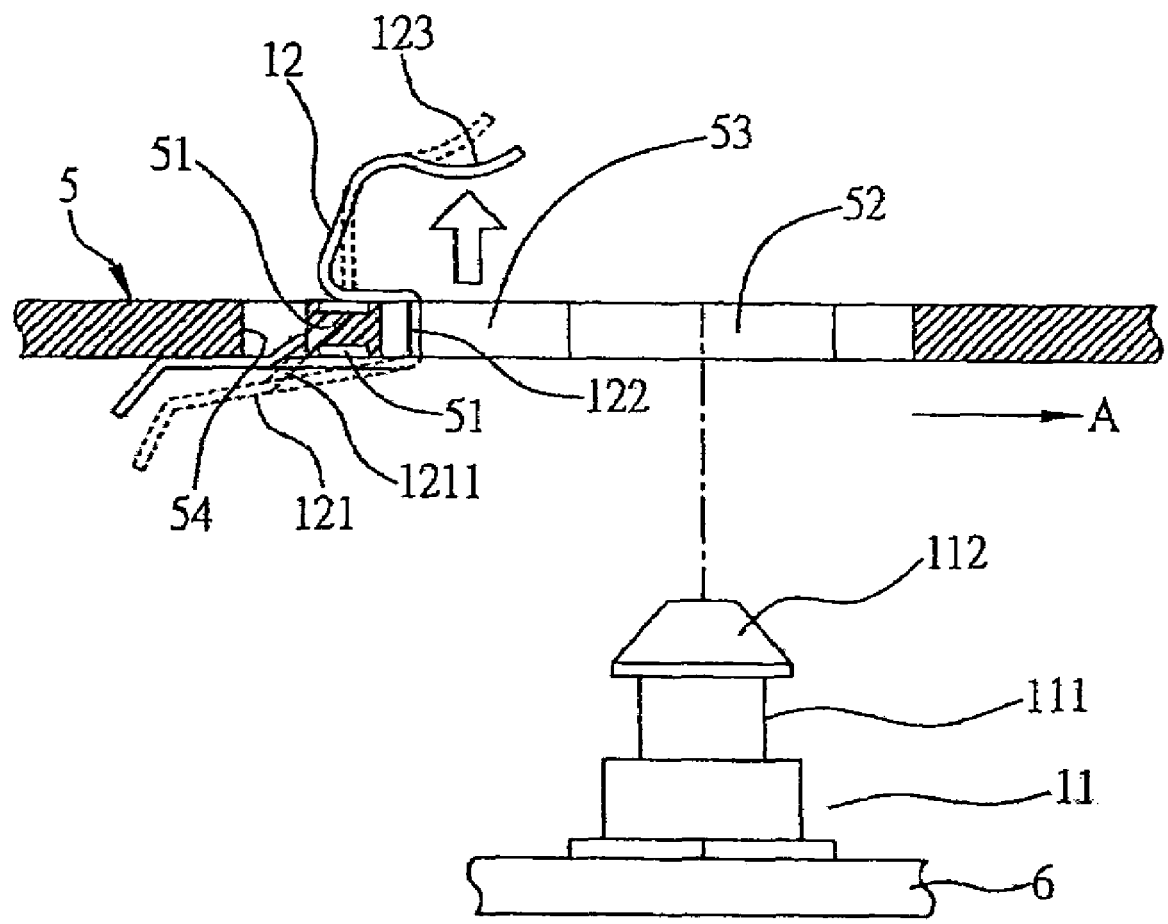
FIG. 1 is a cross sectional view of a ground structure of a circuit board, a circuit board and a housing of an electronic device according to the prior art.
Figure 2:
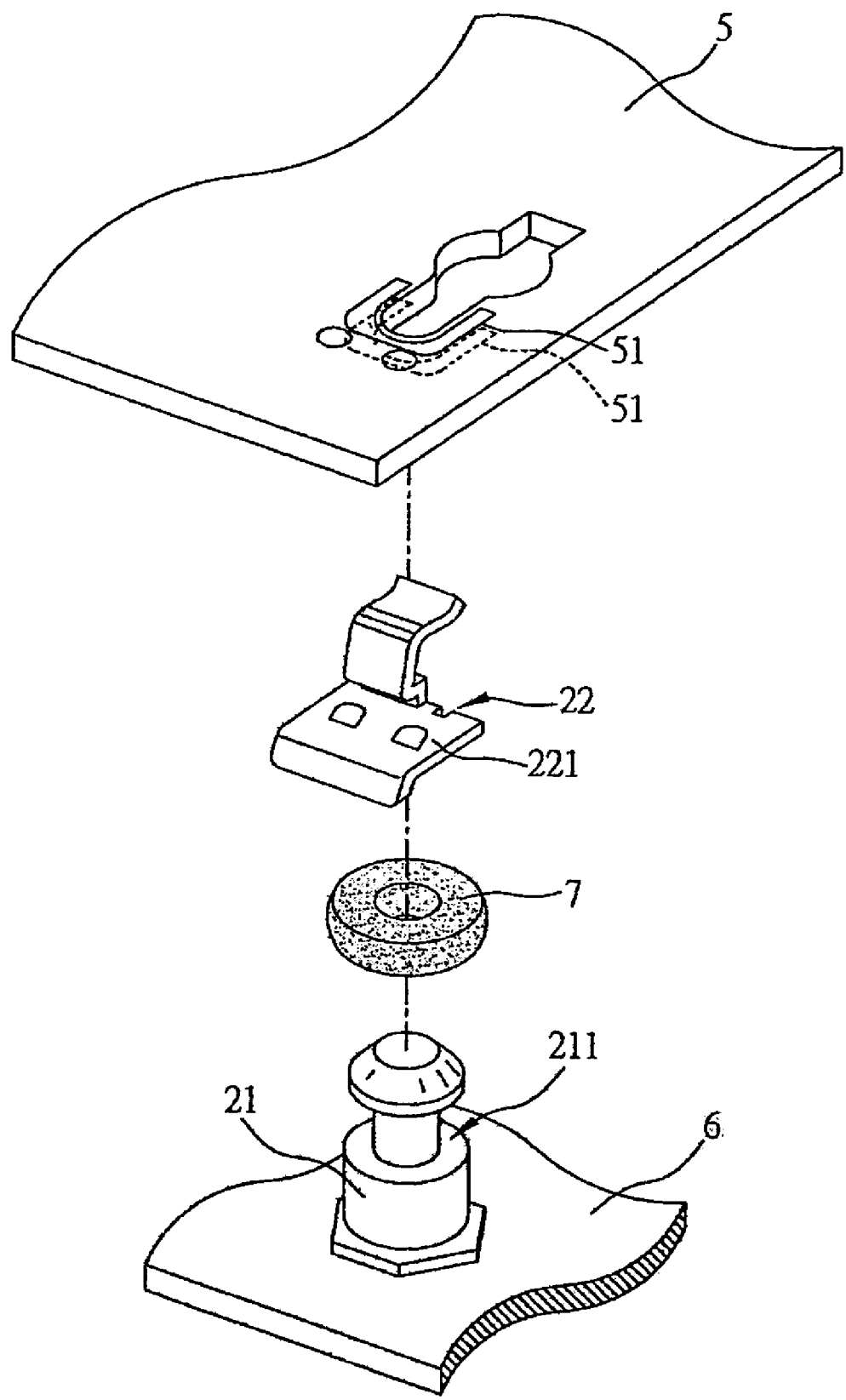
FIG. 2 is an explosive view of another ground structure of the prior art.
Figure 3:
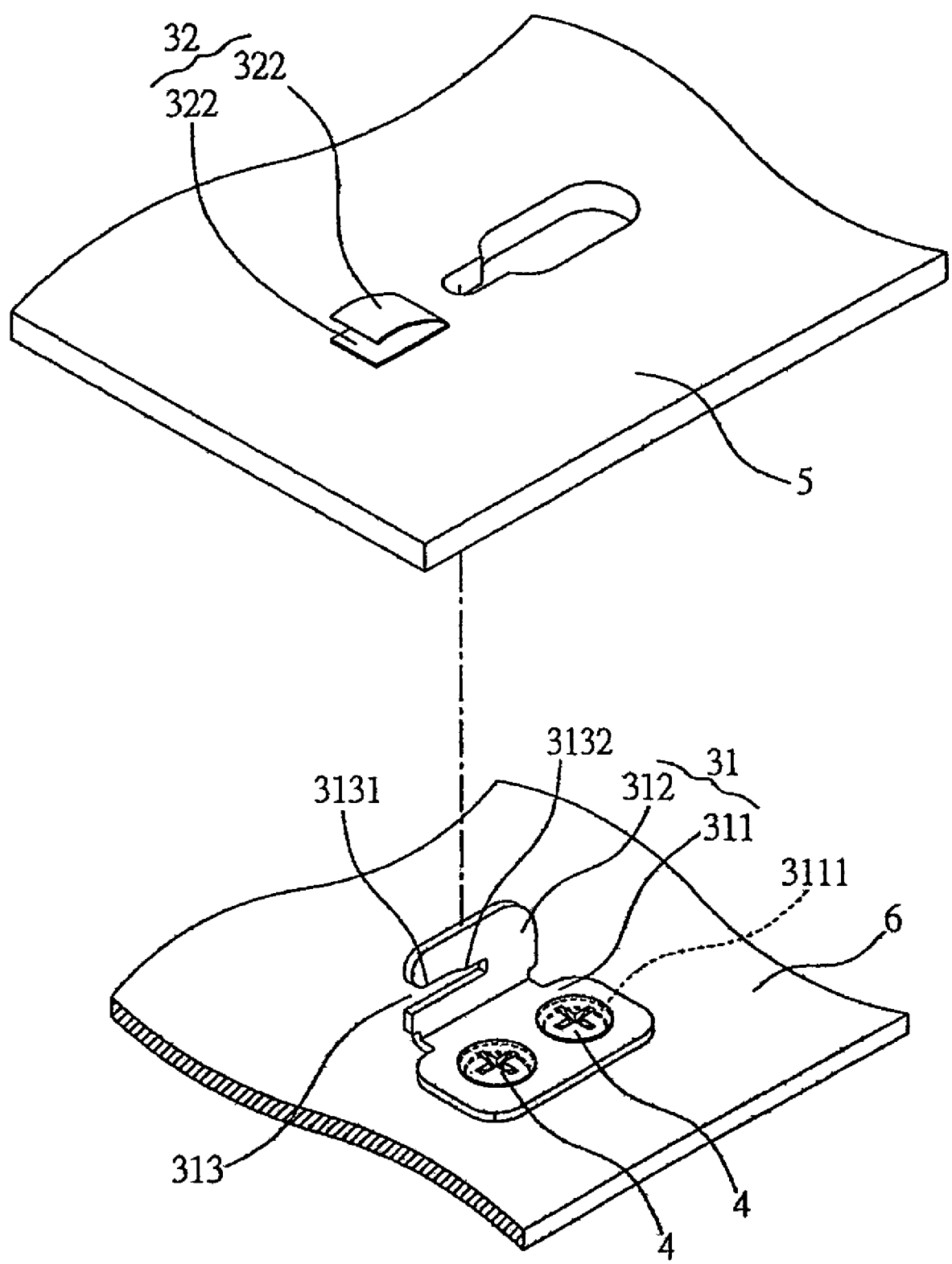
FIG. 3 is an explosive view of an engaging device of a circuit board of the preferred embodiment, a circuit and a housing of an electronic device according to the present invention.

FIG. 3 is an explosive view of an engaging device of a circuit board 5 of the preferred embodiment, the circuit board 5, and a housing 6 of an electronic device according to the present invention. As shown in FIG. 3, the engaging device comprises a conductive hook 31 and a conductive slice 32.

The conductive hook 31 comprises a first engaging portion 311 installed on the housing 6, and a hook portion 312 engaged with the first engaging portion 311. The first engaging portion 311 comprises a plurality of screw holes 3111 for a plurality of screws 4 to pass and fix the conductive hook 31 onto the housing 6.

The hook portion 312 comprises an opening 313. The opening 313 comprises a contacting end 3131 for contacting with the conductive slice 32 and conducting static electricity on the circuit board 5 to ground when the circuit board 5 is fixed to the housing 6, and a fixing end 3132 for fixing to the circuit board 5, so as to fix the circuit board 5 to the housing 6.

The conductive slice 32 comprises a second engaging portion 321 engaged with the circuit board 5, and a top portion 322 connected to the second engaging portion 321 and stuck to a conductive film 51 (shown in FIG. 4) installed on the circuit board 5. According to the preferred embodiment, the conductive slice 32 is a metal leaf spring, a leaf steel, a spring slice, a spring or any other equivalent members capable of generating elastic forces. The second engaging portion 321 is engaged with the circuit board 5 by a soldering technique, a riveting technique or a surface mount technology (SMT) technique. Preferably, the conductive slice 32 is engaged with the circuit board 5 steadily by the SMT technique. The top portion 322 of the conductive slice 32 is in the shape of an arc, so as to correspond to a shape of the contacting end 3131 of the opening 313 of the conductive hook 31.

Figure 4:
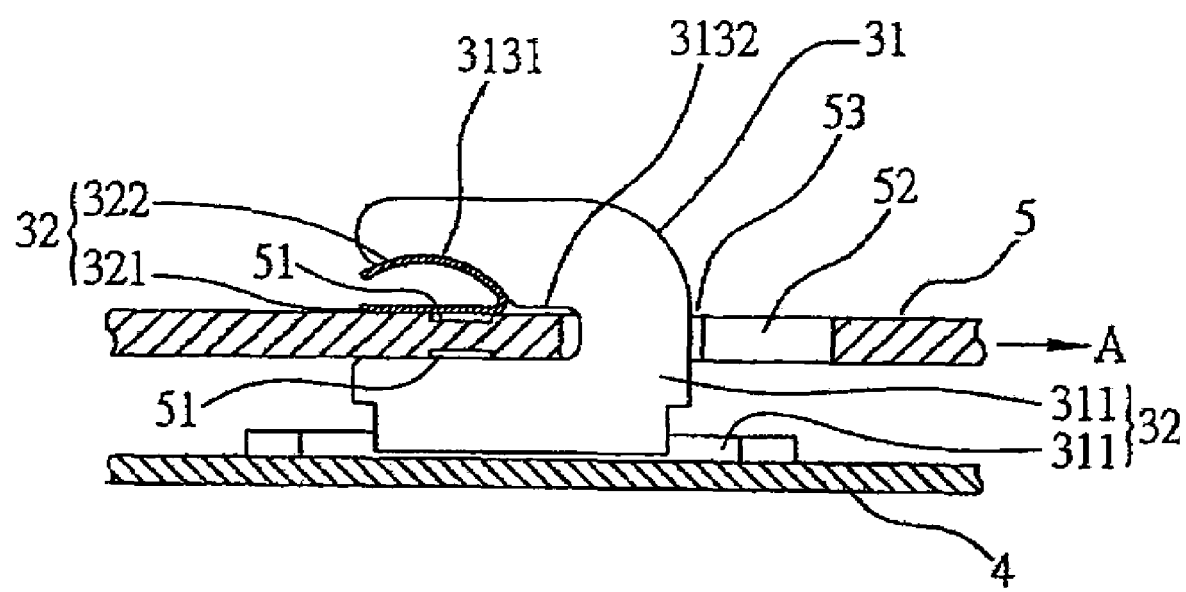
FIG. 4 is an assembly view of the engaging device, the circuit board and the housing shown in FIG. 3.

FIG. 4 is an assembly view of the engaging device, the circuit board 5 and the housing 6. Firstly, mounting the positioning hole 83 installed on the circuit board 5 onto the hook portion 312 of the conductive hook 31, and pushing the circuit board 5 to move toward a direction indicated by arrow A. The conductive hook 31 thus enters a lock hole 85 connected to the positioning hole 83, and the fixing end 3132 of the conductive hook 31 is fixed to one side of the circuit board 5. Further, the contacting end 3131 contacts with the top portion 322 of the conductive slice 32, and is fixed to the circuit board 5 by an elastic force generated by the top portion 322 of the conductive slice 32. Because the conductive hook 31 is connected to the conductive slice 32, the static electricity generated by the circuit board 5 can be conducted to ground. The engaging device has a simple structure, is easy to be manufactured, and has a low manufacturing cost.

In summary, the present invention has the advantages of low manufacturing cost, connecting the circuit board and conducting the static electricity thereon to ground, so as to overcome the drawbacks of the prior art, such as a defect of contact and high manufacturing cost.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. An engaging device of a circuit board, for engaging a circuit board having a positioning hole with a housing of an electronic device, the engaging device comprising:
   a conductive hook fixed to the housing, the conductive hook comprising a hook portion for being hooked the positioning hole, and a contacting end formed on an end of the hook portion; and
   a conductive slice fixed to a side of the circuit board, corresponding to the positioning hole for contacting with the contacting end when the hook portion is hooked to the positioning hole, so as to allow static electricity generated by the circuit board to be conducted to the housing, and improve engaging strength of the conductive hook and the housing.

2. The engaging device of claim 1, wherein the conductive hook further comprises a first engaging portion connected perpendicularly to the hook portion, for being fixed to the circuit board.

3. The engaging device of claim 2, wherein the first engaging portion comprises a plurality of screw holes for being fixed, to the housing by screws.

4. The engaging device of claim 1, wherein the hook portion comprises an opening larger than the circuit board in thickness, and the contacting end is located on an outer end of the opening.

5. The engaging device of claim 4, wherein the hook portion further comprises a fixing end located on an inner end of the opening.

6. The engaging device of claim 1, wherein the conductive slice is one selected from the group consisting of a metal leaf spring, a leaf steel and a spring slice.

7. The engaging device of claim 1, wherein the conductive slice comprises a second engaging portion for being fixed to a surface of the circuit board, and a top portion for contacting with the contacting end.

8. The engaging device of claim 7, wherein the second engaging portion is adhered to the surface of the circuit board.

9. The engaging device of claim 7, wherein the top portion has an arc shape.

* * * * *